(12) United States Patent
Rollins et al.

(10) Patent No.: US 7,994,777 B2
(45) Date of Patent: Aug. 9, 2011

(54) APPARATUS AND METHODS FOR AN INDUCTIVE PROXIMITY SENSOR

(75) Inventors: George E. Rollins, Chelmsford, MA (US); Weihua Chen, Westford, MA (US); Prachi S. Kulkarni, Burlington, MA (US); Diana A. Sufariu, Nashua, NY (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 359 days.

(21) Appl. No.: 11/864,545

(22) Filed: Sep. 28, 2007

(65) Prior Publication Data

US 2009/0085560 A1  Apr. 2, 2009

(51) Int. Cl.
*G01B 7/14* (2006.01)
*H01F 5/00* (2006.01)

(52) U.S. Cl. .......... 324/207.26; 324/207.16; 324/207.17

(58) Field of Classification Search ............. 324/207.26, 324/207.16, 207.17
See application file for complete search history.

(56) References Cited

U.S. PATENT DOCUMENTS 6,236,200 B1 * 5/2001 Nekado et al. ........... 324/207.26

FOREIGN PATENT DOCUMENTS

DE 19748602 A1 6/1999
DE 10057773 A1 5/2002

* cited by examiner

*Primary Examiner* — Reena Aurora
(74) *Attorney, Agent, or Firm* — Schwegman Lundberg et al; William R. Walbrun; John M. Miller

(57) ABSTRACT

An inductive proximity sensor is disclosed. The proximity sensor includes a housing having at least a first pair of inductive coils disposed within the housing. One of the first pair of inductive coils is opposite in polarity from another one of the first pair of inductive coils. The sensor optionally includes a second set of inductive coils, having opposite polarity.

17 Claims, 5 Drawing Sheets

APPARATUS AND METHODS FOR AN INDUCTIVE PROXIMITY SENSOR

TECHNICAL FIELD

The various embodiments described herein relate generally to sensors, including inductive proximity sensors.

BACKGROUND

An automated system enables product manufacturing at greater speeds, lower cost and with a higher safety margin than is generally possible with a manually operated system. Many automated systems employ sensors to guide the movement of the various interworking parts that make up the system. Since the desire to lower product manufacturing costs will likely continue to grow, so will the use of automated systems.

SUMMARY

In an embodiment, a proximity sensor includes a housing having a face, and electronics disposed within the housing, the housing defined in part by a longitudinal axis; at least a first pair of inductive coils disposed within the housing, the first pair of inductive coils disposed on opposite sides of the longitudinal axis, the first pair of inductive coils electrically coupled with the electronics. The sensor optionally includes a second pair of inductor coils disposed within the housing, the second pair of inductive coils disposed on opposite sides of the longitudinal axis, the second pair of inductive coils electrically coupled with the electronics. One of the first pair of inductive coils is opposite in polarity from another one of the first pair of inductive coils, and one of the optional second pair of inductive coils is opposite in polarity from another one of the second pair of inductive coils. In another option, a third pair of inductor coils are included, and are disposed on opposite sides of the longitudinal axis, where the first, second, third pairs of inductor coils are symmetrical about the longitudinal axis.

Several other options for the proximity sensor include disposing the first pair of inductive coils orthogonal to the second pair of inductive coils, or orienting the pairs of inductive coils symmetrically about the longitudinal axis. The sensor housing has optional shapes, such as, but not limited to, a housing having a face with a circular shape, rectangular, or a square shape.

In a further option, a proximity sensor includes a housing having a face and electronics within the housing, the housing defined in part by a longitudinal axis, and the face having an outer dimension D. A first pair and optional second pair of inductive coils are disposed within the housing, where the first pair of inductive coils are disposed on opposite sides of the longitudinal axis and are separated from one another by more than ½*D. The first and second pair of inductive coils each have a first coil that is opposite in polarity from another one of the pair of inductive coils.

Several options for the sensor are as follows. For instance, in an option, the first pair of inductive coils disposed along a first axis, the second pair of inductive coils disposed along a second axis, and the first axis is orthogonal to the second axis. In another option, the first pair of inductive coils are disposed on opposite sides of the longitudinal axis, and the second pair of inductive coils are disposed on opposite sides of the longitudinal axis. In yet a further option, the sensor further includes a third pair of inductor coils, the third pair of inductor coils separated from one another by more than ½*D. In another option, each of the first pair of inductive coils are connected in series, and each of the second pair of inductive coils are connected in series.

A method includes sensing presence of an object with a proximity sensor, the proximity sensor including a housing having a face and electronics within the housing, the housing defined in part by a longitudinal axis. The sensor further includes at least a first pair of inductive coils disposed within the housing, the first pair of inductive coils disposed on opposite sides of the longitudinal axis, and the first pair of inductive coils are electrically coupled with the electronics. The sensor also includes at least a second pair of inductor coils disposed within the housing, the second pair of inductive coils disposed on opposite sides of the longitudinal axis, and the second pair of inductive coils are electrically coupled with the electronics. One of the first pair of inductive coils is opposite in polarity from another one of the first pair of inductive coils, and one of the second pair of inductive coils is opposite in polarity from another one of the second pair of inductive coils. The method further includes sending a signal to the first pair of inductive coils and the second pair of inductive coils, including alternating between sending the signal to the first pair of inductive coils and the second pair of inductive coils.

Options for the method are as follows. For instance, sensing optionally includes sending a signal to a third pair of inductive coils. In another option, sensing optionally includes sending a signal to the first pair and the second pair of inductive coils near an outer periphery of the face. In a further option, the method further includes alternating between sending the signal to the first pair of inductive coils, the second pair of inductive coils, and the third pair of inductive coils.

DETAILED DESCRIPTION

The following detailed description refers to the accompanying drawings that show, by way of illustration, specific details and embodiments in which the invention may be practiced. These embodiments, which are also referred to herein as "examples," or "options" are described in sufficient detail to enable those skilled in the art to practice the invention.

Figure 1:
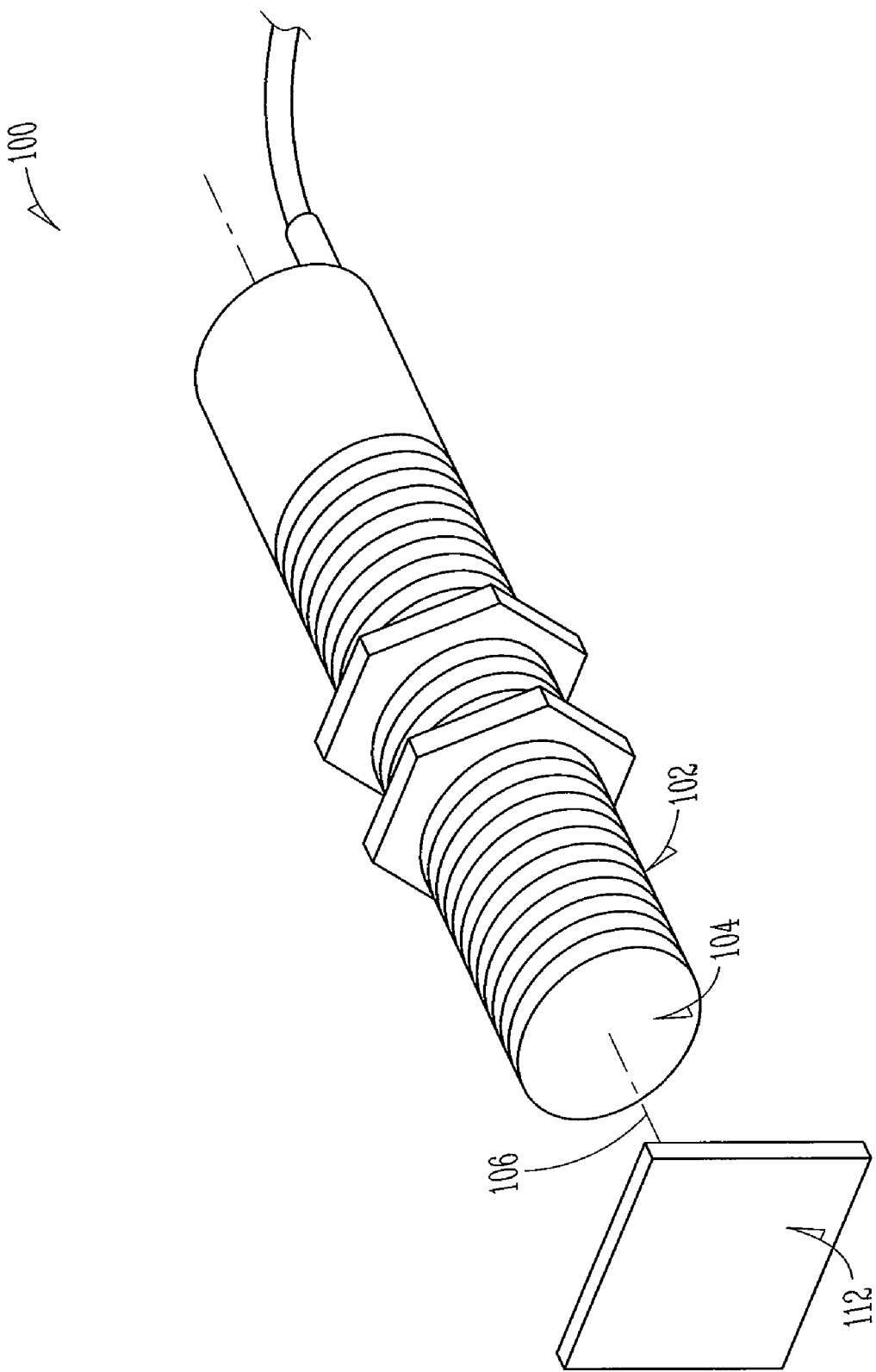
FIG. 1 illustrates a perspective view of an inductive proximity sensor according at least one embodiment.
Figure 5:
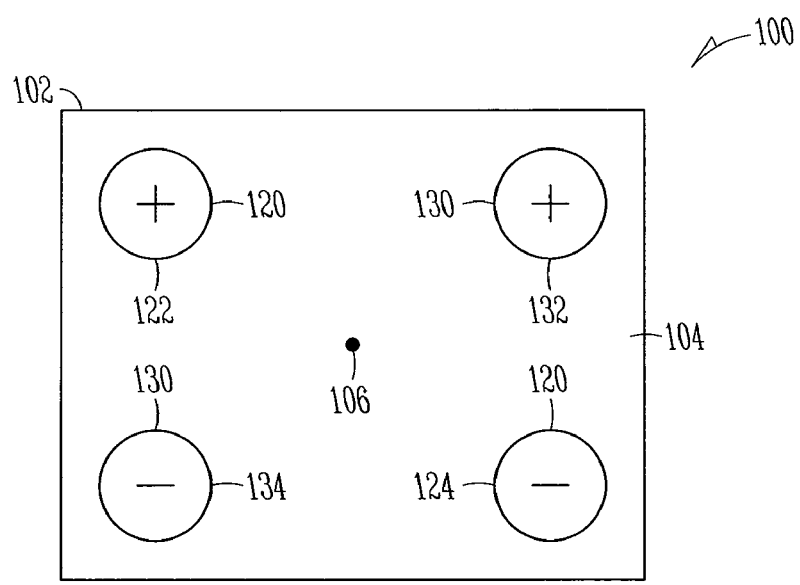
FIG. 5 illustrates an end view of an inductive proximity sensor according to at least one embodiment.
Figure 6A:
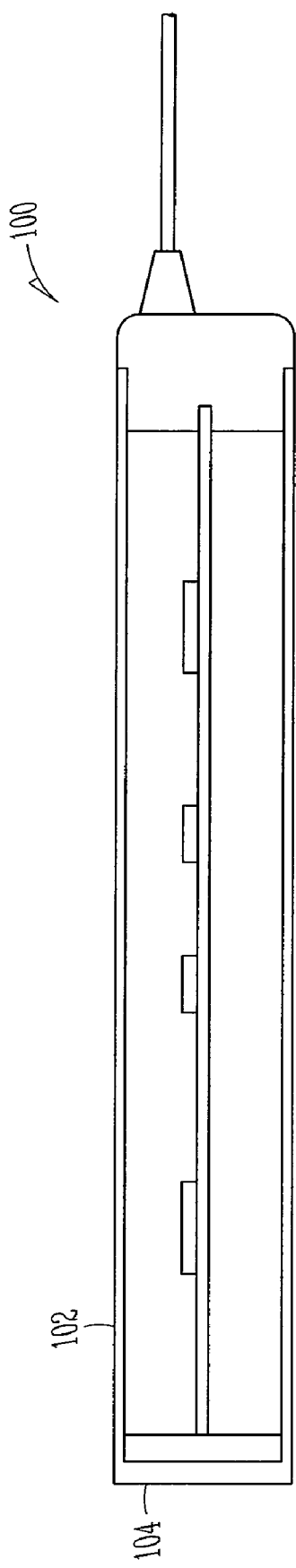
FIG. 6A illustrates a cross-sectional view of an inductive proximity sensor according to at least one embodiment.
Figure 6B:
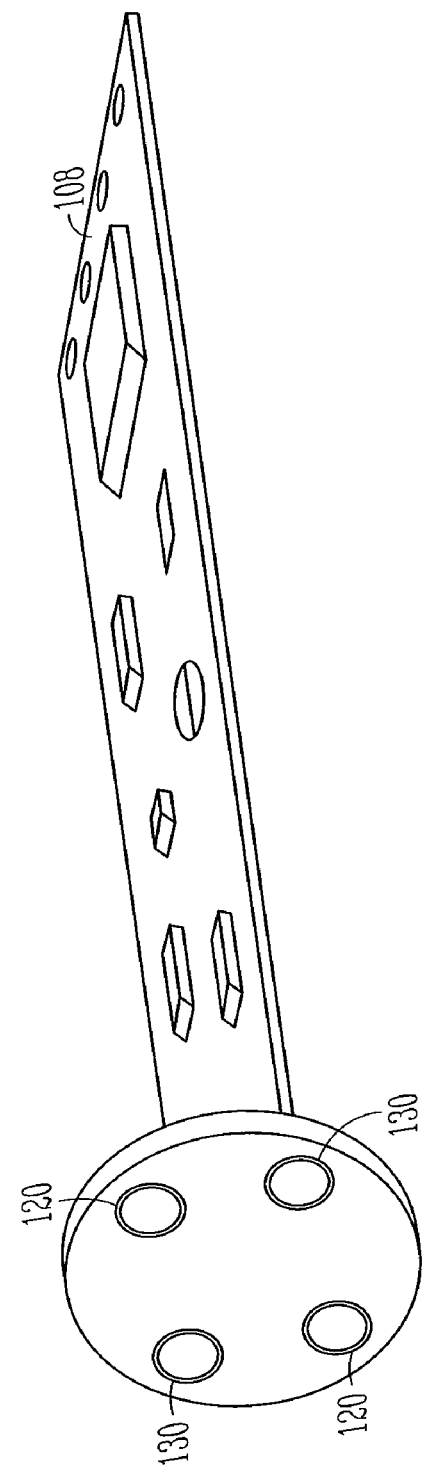
FIG. 6B illustrates a portion of an inductive proximity sensor according to at least one embodiment.

FIG. 1 illustrates an example of a proximity sensor 100 having an elongate cylindrical housing 102. The housing 102 can have a variety of shapes. For instance, the housing 102 can have a rectangular shape (FIG. 5), or a square shape, or other shapes. The housing 102 is defined in part by a longitudinal axis 106. FIGS. 6A and 6B illustrate an example of the sensor of FIG. 1, illustrating internal electronics, such as sensing circuitry 108. In an example, the sensing circuitry 108 is an inductive type of proximity sensor. The proximity sensor 100 further includes at least a first pair of inductive coils 120 electrically coupled with the sensing circuitry 108. The proximity sensor 100 further optionally includes a second pair of inductive coils 130. The coils 120, and optional coils 130, are located adjacent the face 104 of the housing 102, for instance, in an outer periphery of the housing 102. The coils 120 are, in an option, disposed in a position where the longitudinal axis of the coils 120 are substantially parallel with the longitudinal axis of the housing 102, and have substantially the same orientation as the housing 102.

Figure 2:
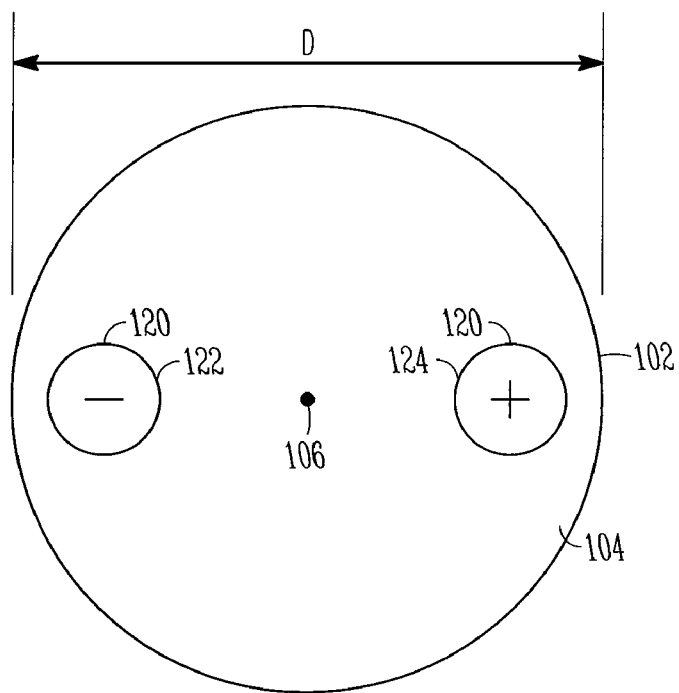
FIG. 2 illustrates an end view of an inductive proximity sensor according to at least one embodiment.

In an example, as illustrated in FIG. 1, the first pair of inductive coils 120 include coils 122 and 124, where coils 122, 124 are separated to the extent possible for the dimensions of the face 104. Referring to FIG. 2, the first pair of inductive coils 120 include coil 122 and coil 124, where the centers of coil 122 and coil 124 are opposite in polarity from one another, and are optionally connected in series. In another option, the coils 120 are connected in parallel. Options for the coils include, but are not limited to, bobbins with or without a core, or a printed circuit coil.

The housing 102 includes face 104, which is defined in part by outer dimension D. In an option, the first pair of inductive coils 120 are separated from one another by more than ½*D. In a further option, a second pair of inductive coils 130 (FIG. 3), discussed below, are separated from one another by more than ½*D, and/or a third pair of inductor coils 140 (FIG. 3) are separated from one another by more than ½*D.

Figure 3:
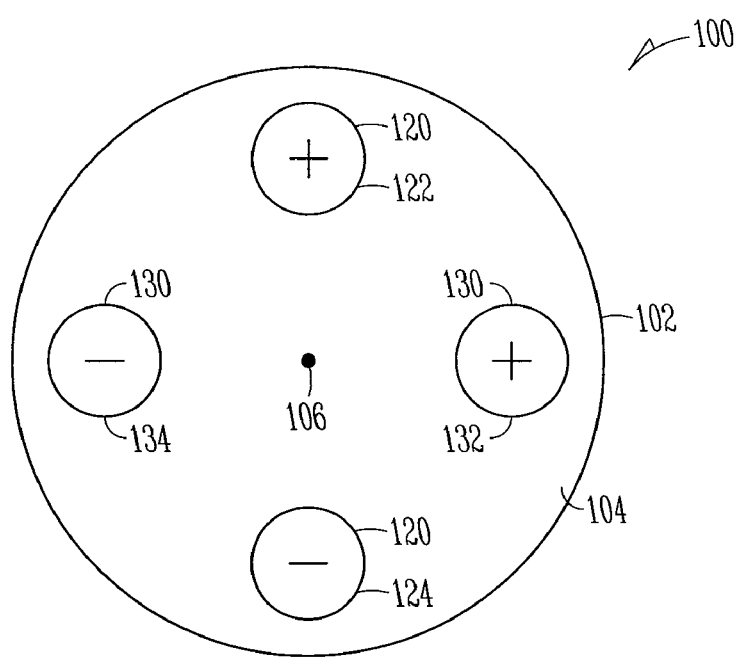
FIG. 3 illustrates an end view of an inductive proximity sensor according to at least one embodiment.

Referring to FIG. 3, a first pair of inductive coils 120, including coil 122 and coil 124, are disposed within the housing 102, for example on opposite sides of the longitudinal axis 106, and/or at an outer periphery of the housing 102. The center of coil 122 is opposite in polarity as the center of coil 124. The sensor 100 further optionally includes a second pair of inductive coils 130, including coil 132 and coil 134, where the center of coil 132 is opposite in polarity as the center of coil 134, for instance by connecting the coils 132, 134 in series. In another option, the coils 132, 134 are connected in parallel. In an option, coils 132, 134 are disposed on opposite sides of the longitudinal axis 106, and/or at an outer periphery of the housing 102. For instance, coils 132, 134 are separated to the extent possible for the dimensions of the face 104. In another option, the first pair of inductive coils 120 are disposed along a first axis, the second pair of inductive coils 130 disposed along a second axis, and the first axis is orthogonal to the second axis, as shown in FIG. 3. The first pair of inductive coils 120 and the second pair of inductive coils 130 are electrically coupled with the electronics, and optionally each of the first pair of inductive coils are connected in series, and each of the second pair of inductive coils are connected in series. The coils can alternatively be connected in parallel.

Figure 4:
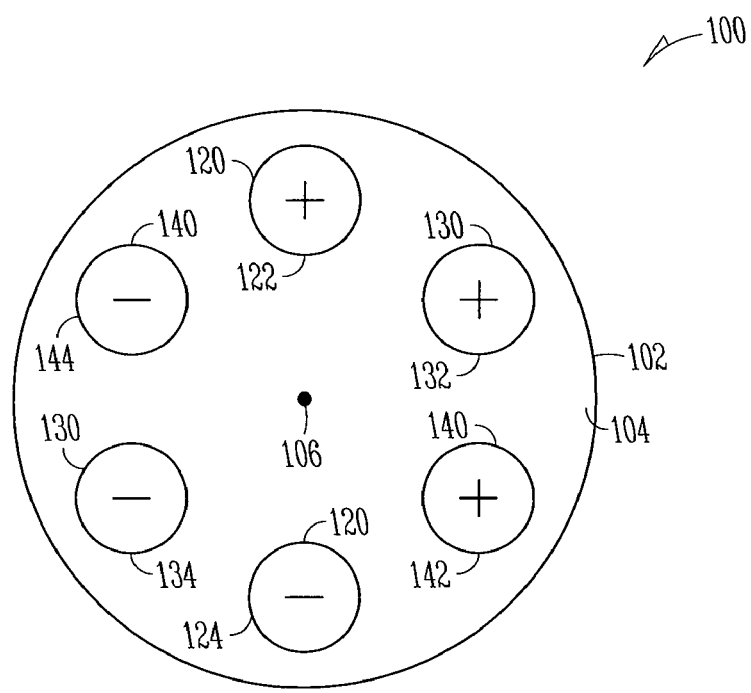
FIG. 4 illustrates an end view of an inductive proximity sensor according to at least one embodiment.

Referring to FIG. 4, the sensor 100 further optionally includes a third pair of inductive coils 140, including coil 142 and coil 144, where coil 142 is opposite in polarity as coil 144. In an option, coils 142, 144 are disposed on opposite sides of the longitudinal axis 106, and/or optionally at an outer periphery of the housing 102. For instance, coils 142, 144 are separated to the extent possible for the dimensions of the face 104. In a further option, the first set of coils 120 and the second set of coils 130 are symmetrical about the longitudinal axis 106. In another option, coils 142, 144 are disposed on opposite sides of the longitudinal axis 106. In a further option, the first set of coils 120 and the second set of coils 130 are symmetrical about the longitudinal axis 106. In yet a further option, the first set of coils 120, the second set of coils 130, and the third set of coils 140 are symmetrical about the longitudinal axis 106.

During use of the sensor 100, the presence of an object is sensed with the proximity sensor, such as the proximity sensor, and variations thereof, discussed above. For instance, an oscillator provides an oscillating signal to the first pair of inductive coils 120, which provides an electromagnetic field at a predetermined frequency. The electromagnetic field extends from the coils 120, optional coils 130, or optional coils 140 through the face 104. In an option, part of the sensing includes sending the signal to the first pair of inductive coils and the second pair of inductive coils 130, alternating between sending the signal to the first pair of inductive coils 120, and then to the second pair of inductive coils 130, to provide a symmetrical extended field. This can be accomplished, for instance, with a clock cycle output. In a further option, the signal is also sent to the third set of inductive coils 140, where it alternates between the first, second and third set of inductive coils 120, 130, 140.

As an electrically conductive object 112 (FIG. 1) moves within the field, eddy currents develop within the object in response to the oscillating electromagnetic field. The eddy currents alter the amplitude of the oscillator signal provided to the inductive coils 120. The circuitry 108 also includes a detector circuit that analyzes the signal and provides an output signal indicative of the proximity (or lack thereof) of the object 112. The amplitude of the oscillator signal, for example, is evaluated to provide an output signal indicative of the presence or absence of the object 112 within the sensing range of the sensor 100. The output signal may be configured to provide a signal to external monitoring equipment and/or an appropriate indicator, such as a light emitting diode (LED) or a display.

Figure 7:
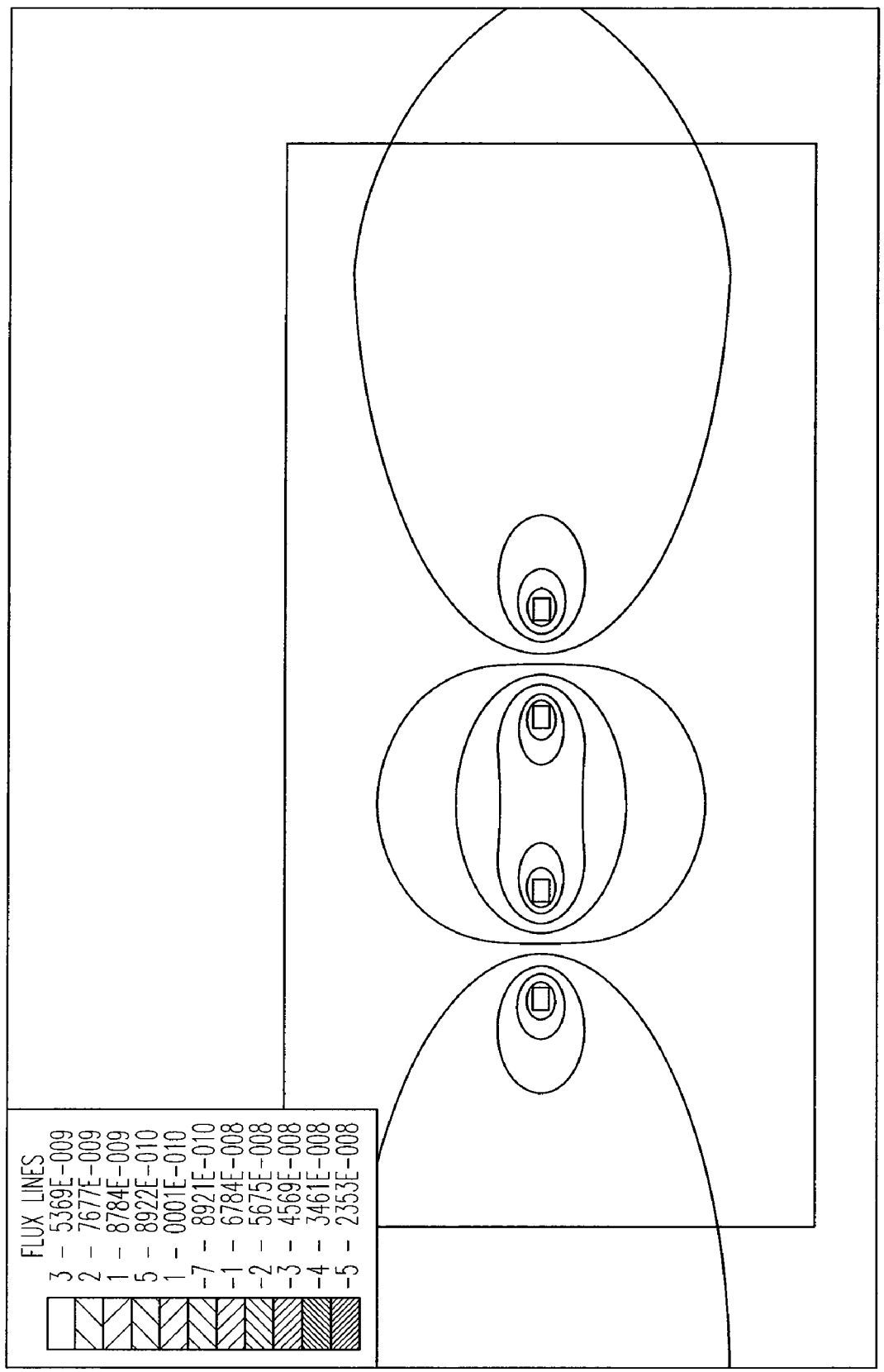
FIG. 7 illustrates a flux simulation plot for an inductive proximity sensor according to at least one embodiment.

The embodiments discussed above allow for an extended field for the sensor, and for better field penetration. FIG. 7 illustrates a flux simulation plot for a proximity sensor using the embodiments as discussed herein. In FIG. 7, the coil cross sections are shown as squares, and the "Y" coordinate on the plot is perpendicular to the face of the housing. The plot shows the oval-shaped extension of the flux pattern axial to the face of the housing. The extension of the flux pattern is due to canceling fields between the pair of coils which restricts return of flux lines between the coils, providing for extension of sensing distance from the face of the sensor housing.

The above Detailed Description is intended to be illustrative, and not restrictive. The various embodiments are not necessarily mutually exclusive, as some embodiments can be combined with one or more other embodiments to form new embodiments. For example, the above-described embodiments (and/or aspects thereof) embodiments may be combined, utilized and derived therefrom, such that structural and logical substitutions and changes may be made without departing from the scope of this disclosure. Such embodiments of the inventive subject matter may be referred to herein, individually and/or collectively, by the term "invention" merely for convenience and without intending to voluntarily limit the scope of this application to any single invention or inventive concept if more than one is in fact disclosed. Many other embodiments will be apparent to those of skill in the art upon reviewing the above description. The scope of the invention should, therefore, be determined with reference to the appended claims, along with the full scope of equivalents to which such claims are entitled.

The methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The terms "a" or "an" are used, as is common in patent documents, to include one or more than one. The term "or" is used to refer to a nonexclusive or, unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C. F. R. §1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment with each embodiment being combinable with each other embodiment.

What is claimed is:

1. A proximity sensor comprising:
   a housing having a face and the housing defined in part by a longitudinal axis;
   electronics within the housing;
   at least a first pair of inductive coils disposed within the housing, the first pair of inductive coils disposed on opposite sides of the longitudinal axis, the first pair of inductive coils electrically coupled with the electronics;
   one of the first pair of inductive coils is opposite in polarity from another one of the first pair of inductive coils;
   at least a second pair of inductor coils disposed within the housing, the second pair of inductive coils disposed on opposite sides of the longitudinal axis, the second pair of inductive coils electrically coupled with the electronics, and one of the second pair of inductive coils is opposite in polarity from another one of the second pair of inductive coils; and
   a third pair of inductor coils, the third pair of inductor coils disposed on opposite sides of the longitudinal axis.

2. The proximity sensor of claim 1, wherein the first, second, third pairs of inductor coils are symmetrical about the longitudinal axis.

3. A proximity sensor comprising:
   a housing having a face and the housing defined in part by a longitudinal axis;
   electronics within the housing;
   at least a first pair of inductive coils disposed within the housing, the first pair of inductive coils disposed on opposite sides of the longitudinal axis, the first pair of inductive coils electrically coupled with the electronics;
   one of the first pair of inductive coils is opposite in polarity from another one of the first pair of inductive coils; and
   at least a second pair of inductor coils disposed within the housing, the second pair of inductive coils disposed on opposite sides of the longitudinal axis, the second pair of inductive coils electrically coupled with the electronics, and one of the second pair of inductive coils is opposite in polarity from another one of the second pair of inductive coils, wherein the first pair of inductive coils is disposed along a first axis, the second pair of inductive coils is disposed along a second axis, and the first axis is orthogonal to the second axis.

4. The proximity sensor of claim 1, wherein each of the first pair of inductive coils are connected in series.

5. The proximity sensor of claim 1, the first pair of inductive coils are disposed near an outer periphery of the face of the housing.

6. The proximity sensor of claim 1, wherein the face of the housing has a circular shape.

7. The proximity sensor of claim 1, wherein the face of the housing has a rectangular shape.

8. A proximity sensor comprising:
   a housing having a face and the housing defined in part by a longitudinal axis, the face having an outer dimension D;
   electronics disposed within the housing;
   at least a first pair of inductive coils disposed within the housing, the first pair of inductive coils disposed on opposite sides of the longitudinal axis and are separated from one another by more than ½*D, the first pair of inductive coils electrically coupled with the electronics; and
   at least a second pair of inductor coils disposed within the housing, the second pair of inductive coils disposed on opposite sides of the longitudinal axis and are separated from one another by more than ½*D, the second pair of inductive coils electrically coupled with the electronics; and
   one of the first pair of inductive coils is opposite in polarity from another one of the first pair of inductive coils, and one of the second pair of inductive coils is opposite in polarity from another one of the second pair of inductive coils, wherein the first pair of inductive coils is disposed along a first axes, the second pair of inductive coils is disposed along a second axis, and the first axis is orthogonal to the second axis.

9. The proximity sensor of claim 8, wherein the housing is an elongated cylindrical housing.

10. The proximity sensor of claim 8, wherein each of the first pair of inductive coils is connected in series, and each of the second pair of inductive coils is connected in series.

11. The proximity sensor of claim 8, wherein the face of the housing has a circular shape.

12. The proximity sensor of claim 8, wherein the face of the housing has a rectangular shape.

13. A proximity sensor comprising:
   a housing having a face and the housing defined in part by a longitudinal axis, the face having an outer dimension D;
   electronics disposed within the housing;
   at least a first pair of inductive coils disposed within the housing, the first pair of inductive coils disposed on opposite sides of the longitudinal axis and are separated from one another by more than ½*D, the first pair of inductive coils electrically coupled with the electronics; and
   at least a second pair of inductor coils disposed within the housing, the second pair of inductive coils disposed on opposite sides of the longitudinal axis and are separated from one another by more than ½*D, the second pair of inductive coils electrically coupled with the electronics;

one of the first pair of inductive coils is opposite in polarity from another one of the first pair of inductive coils, and one of the second pair of inductive coils is opposite in polarity from another one of the second pair of inductive coils; and a third pair of inductor coils, the third pair of inductor coils separated from one another by more than $\frac{1}{2}*D$.

14. A method comprising:

sensing presence of an object with a proximity sensor, the proximity sensor including a housing having a face and the housing defined in part by a longitudinal axis, electronics disposed within the housing, at least a first pair of inductive coils disposed within the housing, the first pair of inductive coils disposed on opposite sides of the longitudinal axis, the first pair of inductive coils electrically coupled with the electronics, at least a second pair of inductor coils disposed within the housing, the second pair of inductive coils disposed on opposite sides of the longitudinal axis, the second pair of inductive coils electrically coupled with the electronics, one of the first pair of inductive coils is opposite in polarity from another one of the first pair of inductive coils, and one of the second pair of inductive coils is opposite in polarity from another one of the second pair of inductive coils, wherein the first pair of inductive coils is disposed along a first axis, the second pair of inductive coils is disposed along a second axis, and the first axis is orthogonal to the second axis; and wherein sensing includes sending a signal to the first pair of inductive coils and the second pair of inductive coils, including alternating between sending the signal to the first pair of inductive coils and to the second pair of inductive coils.

15. The method as recited in claim 14, wherein sensing includes sending the signal to a third pair of inductive coils.

16. The method as recited in claim 15, further comprising alternating between sending the signal to the first pair of inductive coils, the second pair of inductive coils, and the third pair of inductive coils.

17. The method as recited in claim 14, wherein sensing includes sending the signal to the first pair and the second pair of inductive coils near an outer periphery of the face.

* * * * *